(12) United States Patent
Coglitore et al.

(10) Patent No.: US 7,411,784 B2
(45) Date of Patent: Aug. 12, 2008

(54) ELECTROMAGNETIC INTERFERENCE SHIELD FOR I/O PORTS

(75) Inventors: Giovanni Coglitore, Saratoga, CA (US); Jack E. Randall, Felton, CA (US); Matthew P. Casebolt, Fremont, CA (US)

(73) Assignee: Rackable Systems, Inc., Fremont, CA (US)

( * ) Notice: Subject to any disclaimer, the term of this patent is extended or adjusted under 35 U.S.C. 154(b) by 304 days.

(21) Appl. No.: 11/125,424

(22) Filed: May 9, 2005

(65) Prior Publication Data

US 2005/0265003 A1    Dec. 1, 2005

Related U.S. Application Data

(60) Provisional application No. 60/569,020, filed on May 7, 2004, provisional application No. 60/569,019, filed on May 7, 2004, provisional application No. 60/568,969, filed on May 7, 2004, provisional application No. 60/569,025, filed on May 7, 2004.

(51) Int. Cl.
*G06F 1/16* (2006.01)

(52) U.S. Cl. ..................................... 361/686

(58) Field of Classification Search .................. 361/686
See application file for complete search history.

(56) References Cited

U.S. PATENT DOCUMENTS

| 4,898,009 | A | * | 2/1990 | Lakoski et al. ................ 70/58 |
| 5,045,636 | A | * | 9/1991 | Johnasen et al. ............ 174/375 |
| 5,202,536 | A | | 4/1993 | Buonanno |
| 5,347,430 | A | | 9/1994 | Curlee et al. |
| 5,351,176 | A | | 9/1994 | Smith Stephen W. et al. |
| 5,392,192 | A | * | 2/1995 | Dunn et al. ................. 361/683 |
| 5,466,059 | A | * | 11/1995 | Liu ........................... 312/223.2 |
| 5,564,930 | A | * | 10/1996 | Yu ................................ 439/61 |
| 5,569,878 | A | * | 10/1996 | Zielinski ..................... 174/364 |
| 5,684,271 | A | | 11/1997 | Scholder et al. |
| 5,726,866 | A | | 3/1998 | Allen |
| 5,822,182 | A | * | 10/1998 | Scholder et al. ............. 361/683 |
| 5,977,480 | A | * | 11/1999 | Timieski ..................... 174/375 |
| 6,023,415 | A | * | 2/2000 | Mayer et al. ................ 361/816 |
| 6,114,622 | A | * | 9/2000 | Draeger ...................... 174/384 |
| 6,125,031 | A | * | 9/2000 | Della Fiora et al. ......... 361/683 |
| 6,163,454 | A | | 12/2000 | Strickler |
| 6,215,659 | B1 | | 4/2001 | Chen |
| 6,229,714 | B1 | * | 5/2001 | Rosales ...................... 361/818 |
| 6,239,358 | B1 | * | 5/2001 | Chang ........................ 174/362 |
| 6,252,160 | B1 | | 6/2001 | Chang et al. |

(Continued)

*Primary Examiner*—Lisa Lea-Edmonds
(74) *Attorney, Agent, or Firm*—Cooley Godward Kronish (57) ABSTRACT

A computer system is provided, including: a computer chassis configured to retain a motherboard having a plurality of I/O (input/output) connectors mounted thereon; and an electrically conductive door movable from an open position to a closed position, wherein when said door is in the open position, the I/O connectors are exposed, and when said door is in the closed position, the I/O connectors are covered. A method of operating a computer including a motherboard having a plurality of I/O (input/output) connectors mounted thereon is provided. The method includes operating the computer to generate electromagnetic signals, and blocking the electromagnetic signals with an electrically conductive door movable from an open position to a closed position, wherein when said door is in the open position, the I/O connectors are exposed, and when said door is in the closed position, the I/O connectors are covered.

17 Claims, 7 Drawing Sheets

U.S. PATENT DOCUMENTS

| | | |
|---|---|---|
| 6,349,042 B1 | 2/2002 | Mills et al. |
| 6,414,851 B2 | 7/2002 | Cherniski et al. |
| 6,477,061 B1 | 11/2002 | Johnson |
| 6,480,398 B1 | 11/2002 | Fiora et al. |
| 6,496,366 B1 | 12/2002 | Coglitore et al. |
| 6,512,673 B1 | 1/2003 | Wiley |
| 6,560,114 B2 | 5/2003 | Berry et al. |
| 6,621,000 B2 | 9/2003 | Jensen et al. |
| 6,628,512 B2 * | 9/2003 | Searby et al. ............... 361/683 |
| 6,718,408 B2 * | 4/2004 | Esterberg et al. .............. 710/62 |
| 6,862,173 B1 | 3/2005 | Konshak et al. |
| 7,042,720 B1 | 5/2006 | Konshak et al. |
| 2003/0124971 A1 | 7/2003 | Williams |
| 2003/0128516 A1 | 7/2003 | Faneuf et al. |
| 2005/0265004 A1 | 12/2005 | Coglitore et al. |

* cited by examiner

ELECTROMAGNETIC INTERFERENCE SHIELD FOR I/O PORTS

RELATED APPLICATION

The present application claims the benefit of U.S. Provisional Patent Application Nos. 60/569,020, filed on May 7, 2004 and entitled "ELECTROMAGNETIC INTERFERENCE SHIELD FOR I/O PORTS"; 60/568,969, filed May 7, 2004 and entitled "INTERFACE ASSEMBLY"; 60/569,025, filed May 7, 2004, entitled "RACK MOUNTED COMPUTER SYSTEM"; and 60/569,019, filed May 7, 2004 and entitled "DIRECTIONAL FAN ASSEMBLY", all of which are hereby incorporated by reference as if fully set forth herein.

BACKGROUND

1. Field

This is related generally to electronic equipment, such as computer systems including a plurality of input/output connectors associated therewith. Certain aspects relate to methods and systems for selectively shielding or blocking electromagnetic signals from a computer system.

2. Description of Related Art

Electronic equipment, such as computers in a rack-based server system, radiate electromagnetic signals, which can cause electromagnetic interference (EMI) adversely affecting other electronic equipment positioned nearby. The amount of radiated EMI has increased with increasing operational frequencies and power of contemporary computers. Computer designers typically attempt to eliminate or reduce EMI by enclosing the computer in electromagnetic shielding. However, these computers generally contain a plurality of components that need to be periodically accessed by the computer operator, such as I/O ports, storage devices, removable media, and power supplies. Therefore, the housing providing the electromagnetic shielding should provide some access to those components.

Figure 1:
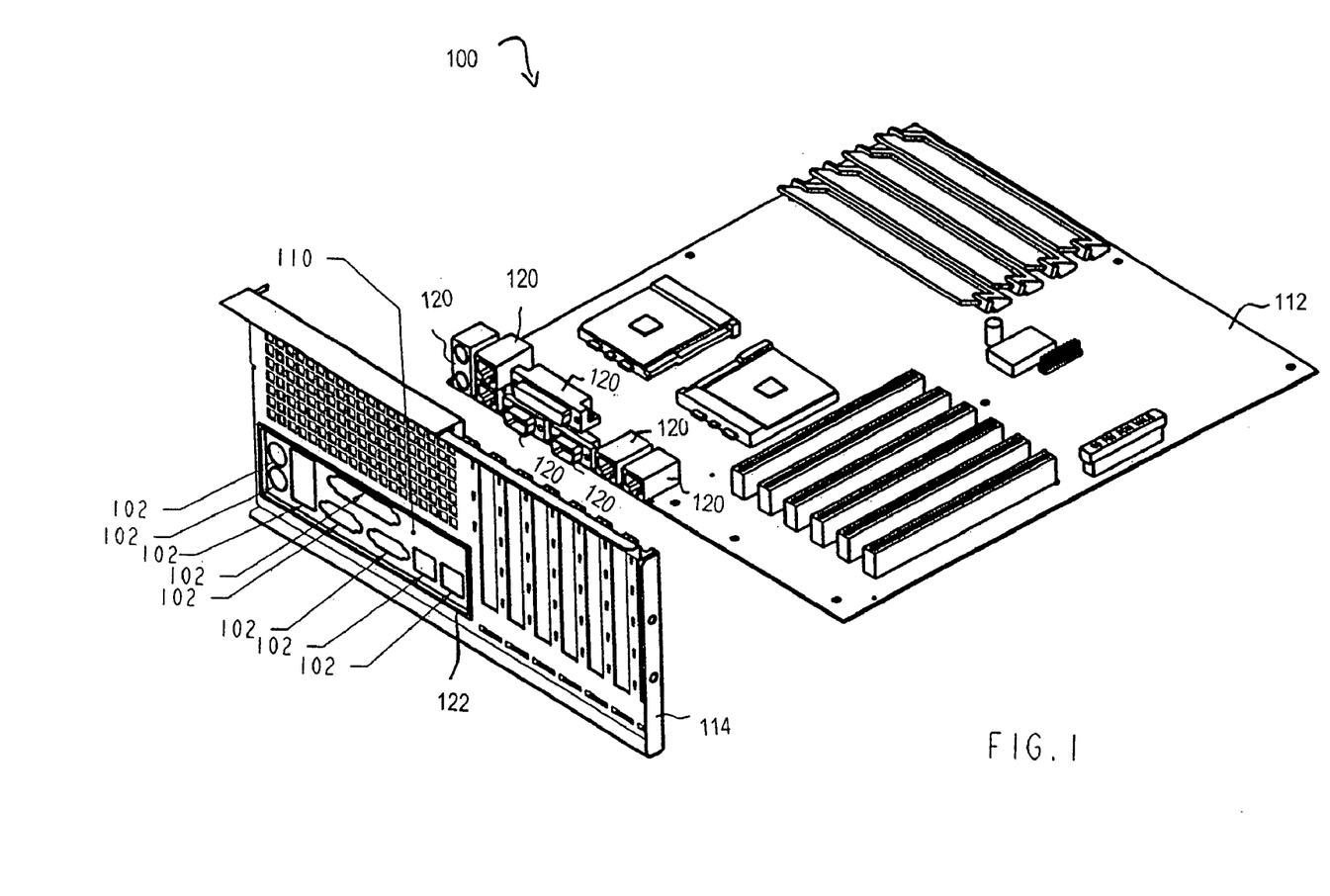
FIG. 1 is a view of a computer system having a prior art I/O shield.

Computers typically include a plurality of input/output (I/O) ports for coupling the computers with network cables or other external devices. FIG. 1 shows a prior art group of I/O ports on a computer 100 (only the motherboard 112 and the front panel 114 are shown). These I/O ports typically comprise board-mounted portions mounted onto the computer motherboard 112 and terminating in I/O connectors 120 (e.g., sockets) which can be coupled with corresponding I/O connectors for each I/O device being connected to the computer (e.g., plugs that can be inserted into the I/O connector 120). I/O ports may be used, for example, for connecting the computer to peripherals, network cables, keyboards, monitors, and the like.

When a plurality of I/O connectors 120 are provided in an opening 122 along a single wall of the computer enclosure, the I/O connectors 120 are usually separated from the edges of the opening 122 and from each other by small gaps. These gaps may allow an unacceptable amount of electromagnetic signals to radiate from the computer. Therefore, a sheet metal I/O shield 110 having a plurality of I/O connector openings 102 is typically used to receive the I/O connectors 120 and to provide EMI shielding for the gaps between the I/O connectors 120. These I/O shields 110 are sometimes referred to as EMI/RFI connector gaskets. However, because a single metal sheet is used to shield multiple I/O connectors, any redesign of the I/O connector layout would require that a new I/O shield be designed and fabricated. This can undesirably increase manufacturing costs, in addition to adding delays to the design timeline for new products. In addition, if a manufacturer has multiple computer models, multiple I/O shield designs must be kept in stock in order to be available for new orders.

Accordingly, it may be desirable to provide a system for blocking or reducing undesirable EMI emissions, while maintaining flexibility in I/O connector layout.

SUMMARY OF THE INVENTION

According to one aspect, a computer system is provided. In one example, the computer system includes a computer chassis configured to retain a motherboard having a plurality of I/O (input/output) connectors mounted thereon; and an electrically conductive door (e.g., a shield) movable from an open position to a closed position, wherein when said door is in the open position, the I/O connectors are exposed, and when said door is in the closed position, the I/O connectors are covered.

According to another aspect, methods of operating a computer system comprising a motherboard having a plurality of I/O (input/output) connectors mounted thereon is provided. In one example, the method includes operating the computer to generate electromagnetic signals; and blocking at least a portion of the electromagnetic signals with an electrically conductive door movable from an open position to a closed position, wherein when said door is in the open position, the I/O connectors are exposed, and when said door is in the closed position, the I/O connectors are covered.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Figure 2A:
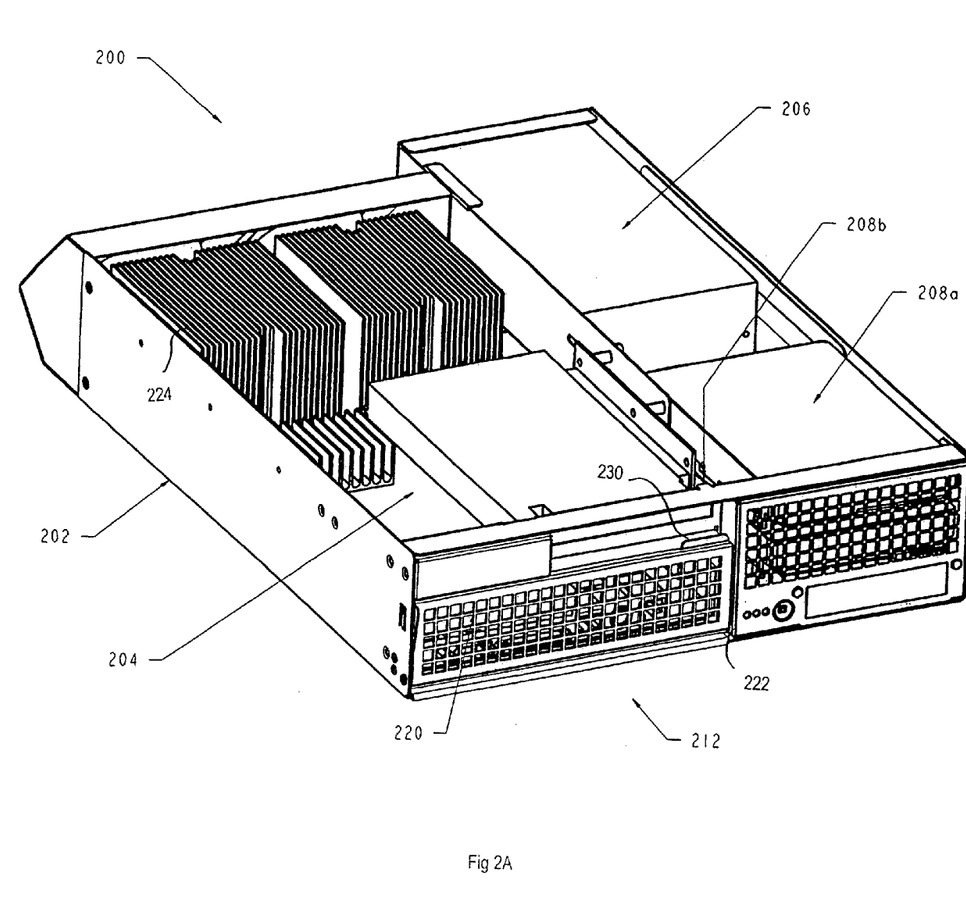
FIGS. 2A-2B show perspective views of a computer with the top cover removed, in accordance with embodiments of the present invention.
Figure 2B:
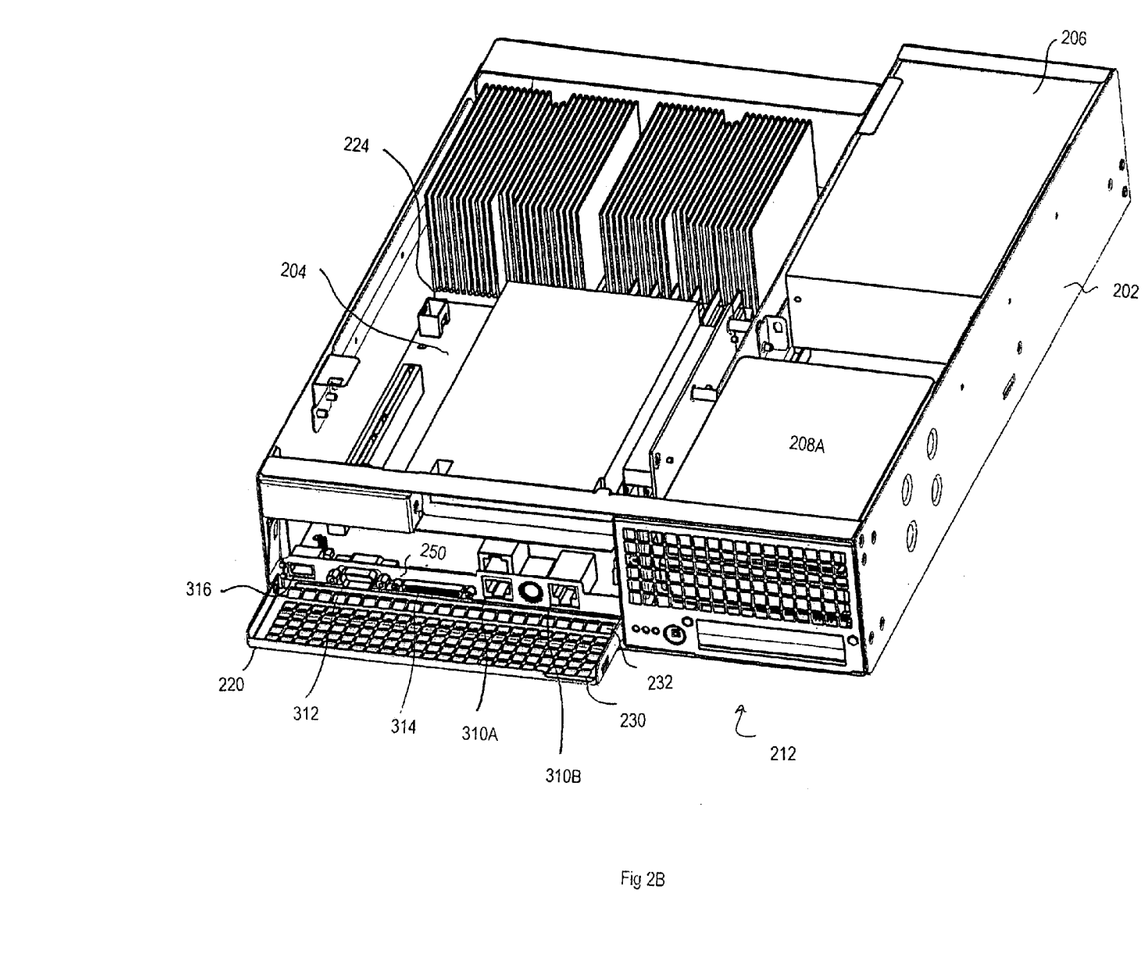

FIGS. 2A and 2B show perspective views of a computer 200 with the top cover 210 removed, in accordance with embodiments of the present invention. The computer 200 may comprise a computer chassis 202 containing a motherboard 204 and other components, such as one or more power supplies 206, hard drives 208a-208b, processors 224, and expansion cards. An exemplary computer 200 is described in greater detail in the following U.S. patent applications, all filed on May 7th, 2004, the disclosures of which are incorporated by reference herein in their entireties: provisional patent application No. 60/568,969, entitled "INTERFACE ASSEMBLY"; provisional patent application No. 60/569,025, entitled "RACK MOUNTED COMPUTER SYSTEM", and provisional patent application No. 60/569,019, entitled "DIRECTIONAL FAN ASSEMBLY".

A computer may include any electronic system designed to perform computations and/or data processing. In some embodiments, the computer includes an electronic device having a central processing unit (CPU) and memory. The CPU and memory may be provided on a main board, which, in turn, may be mounted to a computer chassis. This chassis may comprise, for example, a housing that encloses all or portions of the main board and components coupled thereto. Alternatively, the computer may comprise a printed circuit board (PCB) main board having exposed components without an enclosure. The chassis may comprise a minimal structure (such as, e.g., a tray or frame) which provides mechanical support for the main board when the main board is being handled or mounted in a rack.

Computer 200 may be configured to be mounted in a computer rack assembly with the front side 212 of the computer 200 facing outward such that it is accessible to the computer operator. The front side 212 may include various features that the operator may wish to access during use. These features may include, for example, an on/off switch, a floppy drive, and an I/O door 220 covering an I/O port access aperture 222.

The I/O door 220 is shown in the closed position in FIG. 2A and in the open position in FIG. 2B. When the I/O door 220 is in the open position, a plurality of I/O ports are exposed and accessible to the operator through the I/O port access aperture 222. The types of I/O ports may vary depending on the motherboard configuration, but may include, for example, one or more network connectors 310a-310b (shown in this embodiment as female RJ45 connectors), a video port 312, a SCSI port 314, a USB port 316. The I/O ports may further include, for example, parallel ports, SCSI ports, mouse and/or keyboard ports, such as AT or PS/2 connectors.

Figure 3:
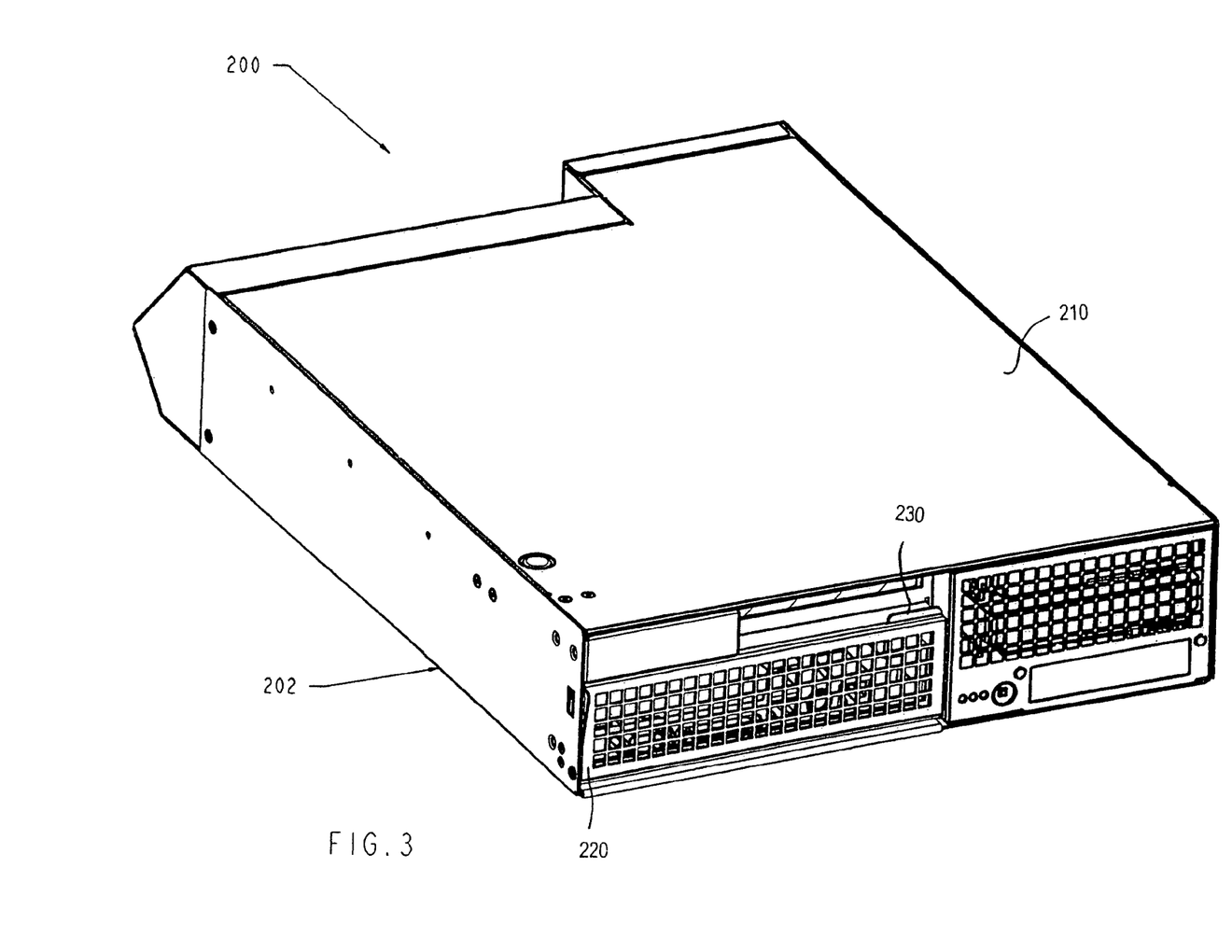
FIG. 3 shows another perspective view of a computer in accordance with embodiments of the present invention.
Figure 4:
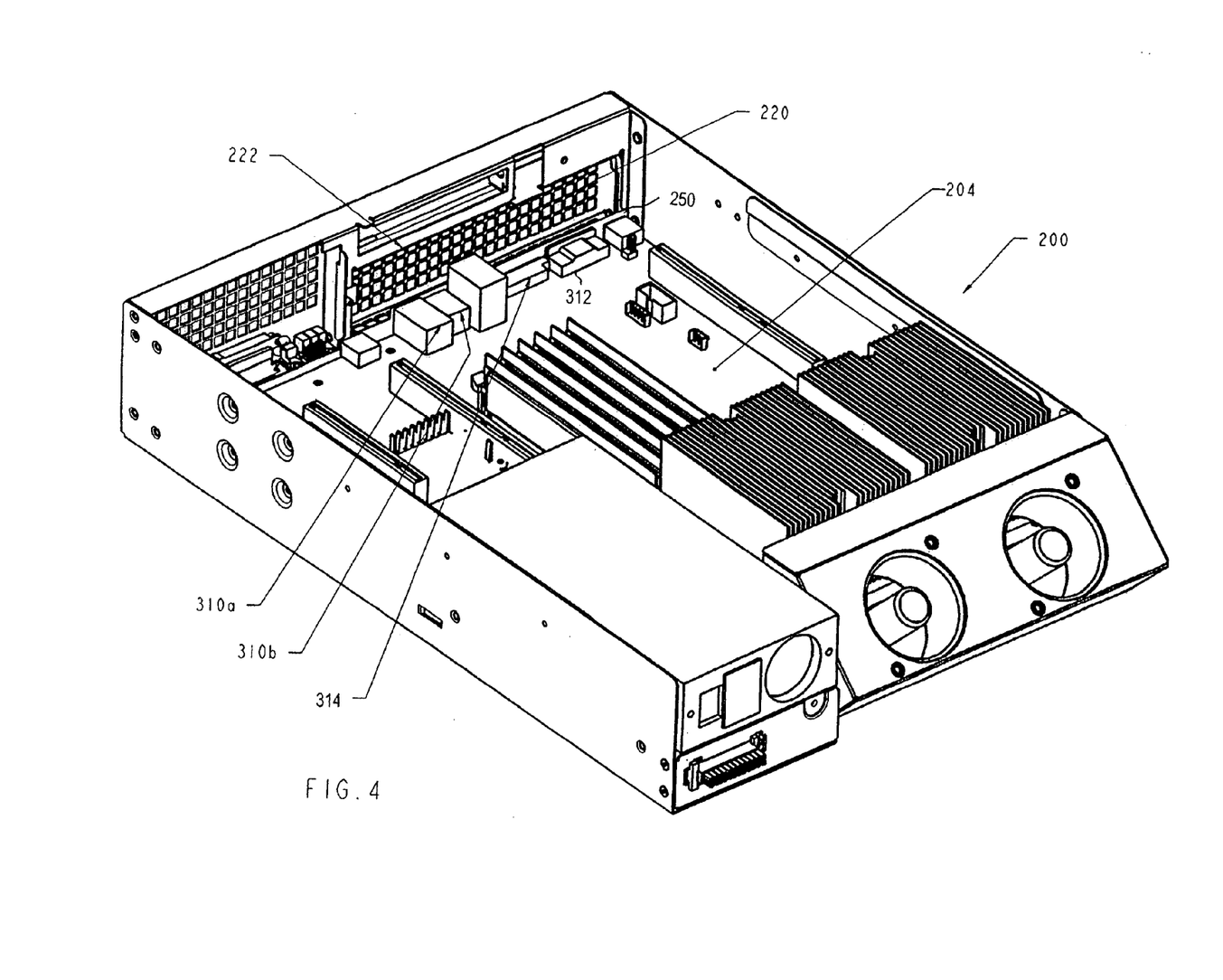
FIG. 4 shows a perspective view of the back side of an I/O door in the closed position, in accordance with embodiments of the present invention.
Figure 5:
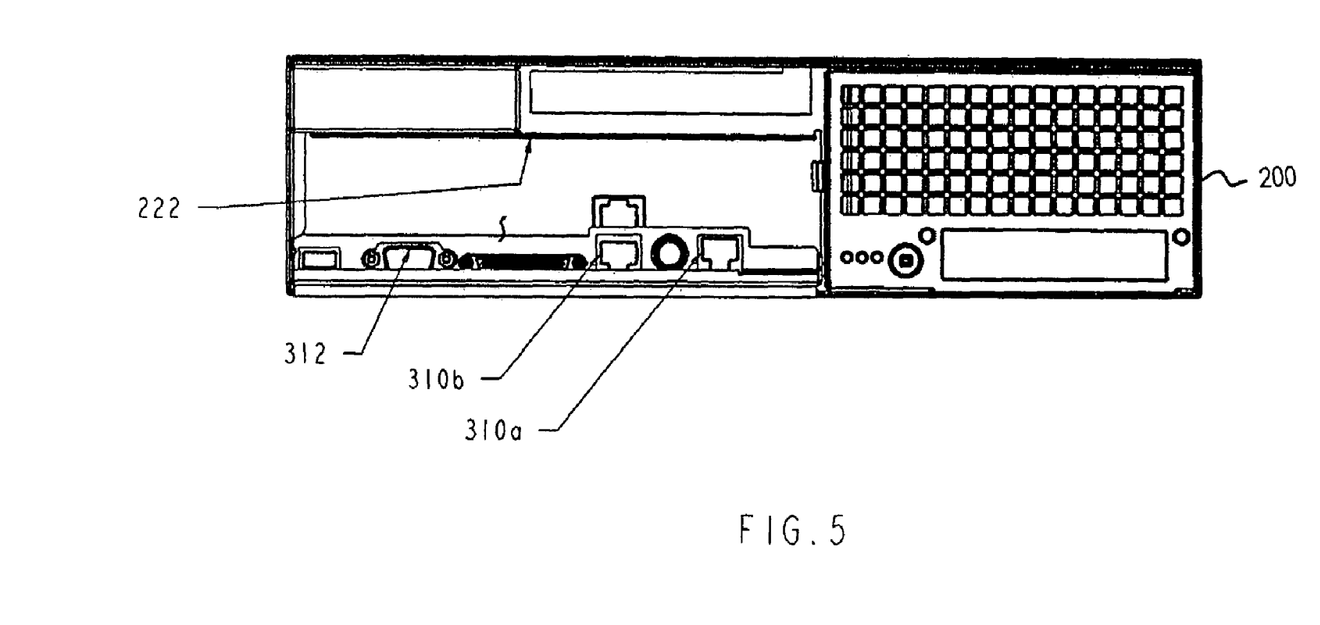
FIG. 5 shows a front view of the I/O door in the open position, in accordance with embodiments of the present invention.

FIG. 3 shows a perspective view of the computer 200 with the top cover 210 in place and the I/O door 220 in the closed position. FIG. 4 shows a perspective view of the back side of the computer 200, showing the back side of the I/O door 220. FIG. 5 shows a front view of the computer 200, showing the I/O door 220 in the open position exposing the I/O ports of the computer 200.

It can be seen that there are gaps between the various I/O ports exposed by the I/O port access aperture 222. In a conventional arrangement, an I/O shield would be fabricated based on the layout of these I/O ports and would be fitted into a hole on one of the walls of the computer chassis. This I/O shield would block the electromagnetic signals from emanating out of the computer 200. Without the I/O shield, the electromagnetic signals may pass through the gaps between and around the various I/O ports and radiate from the opening defined by the I/O port access aperture 222. However, in the illustrated embodiment, the I/O shield can be omitted and the I/O door 220 can be used instead to inhibit the radiation of the electromagnetic signals.

In the illustrated embodiment, I/O door 220 comprises an electrically conductive material, such as stainless steel, which provides shielding to inhibit the emissions of electromagnetic signals when computer 200 is in operation. The I/O door 220 may comprise, for example, a solid plate, or may contain small slits or apertures which provide a desired level of EMI shielding, yet allow air to pass through the I/O door 220 into and/or out of the interior of the computer 200, for example, to cool components of computer 200. In some embodiments, I/O door 220 may be formed at least partially out of an electrically non-conductive material, such as, e.g., plastic, in order to decrease manufacturing costs and improve aesthetic appearance. A conductive insert, such as, e.g., a wire mesh screen or a perforated metal plate, may be added to a plastic body in order to provide the desired levels of EMI shielding.

The I/O door 220 may be configured to be movable from a closed position, as shown in FIG. 2A, to an open position, as shown in FIG. 2B. In the illustrated embodiments, the I/O door 220 is mounted on a hinge, thereby enabling the I/O door 220 to rotate about an axis between the open and closed position. A flange 230 may be provided on the I/O door 220 to facilitate easy opening by a user. In other examples, the I/O door may slide between the open and closed positions. In yet other examples, the I/O door may be removable to expose the I/O ports. Other I/O door configurations may be used, as would be understood by one of ordinary skill in the art.

When the I/O door 220 is in the closed position, the I/O port access aperture 222 is sufficiently shielded to reduce electromagnetic emissions to an acceptable level. Accordingly, no separate I/O shield is needed to block the electromagnetic signals radiating through the gaps between the I/O ports (e.g., network ports 310a-310b and serial port 312). When an operator wishes to access the I/O ports, I/O door 220 can be opened to expose the I/O port access aperture 222. Depending on the application, the operator may only need to access the I/O ports on an infrequent basis, so the EMI caused by the opening of the I/O door may be negligible.

In some embodiments, it may be desired to run a cable into the front of the computer 200 for connection with one of the I/O ports, such as, e.g., network port 310a. In this situation, the I/O door 220 may be left in a partially open position to provide sufficient clearance for the network cable to pass through the I/O port access aperture 222, while still blocking the desired amount of the electromagnetic signals emitted by the computer 200. It may be desirable to provide spring-loaded hinges for the I/O door 220 in order to provide a constant bias to move the I/O door 220 into the closed position, thereby minimizing the extent that the I/O door 220 is opened to accommodate the network cable.

Figure 6:
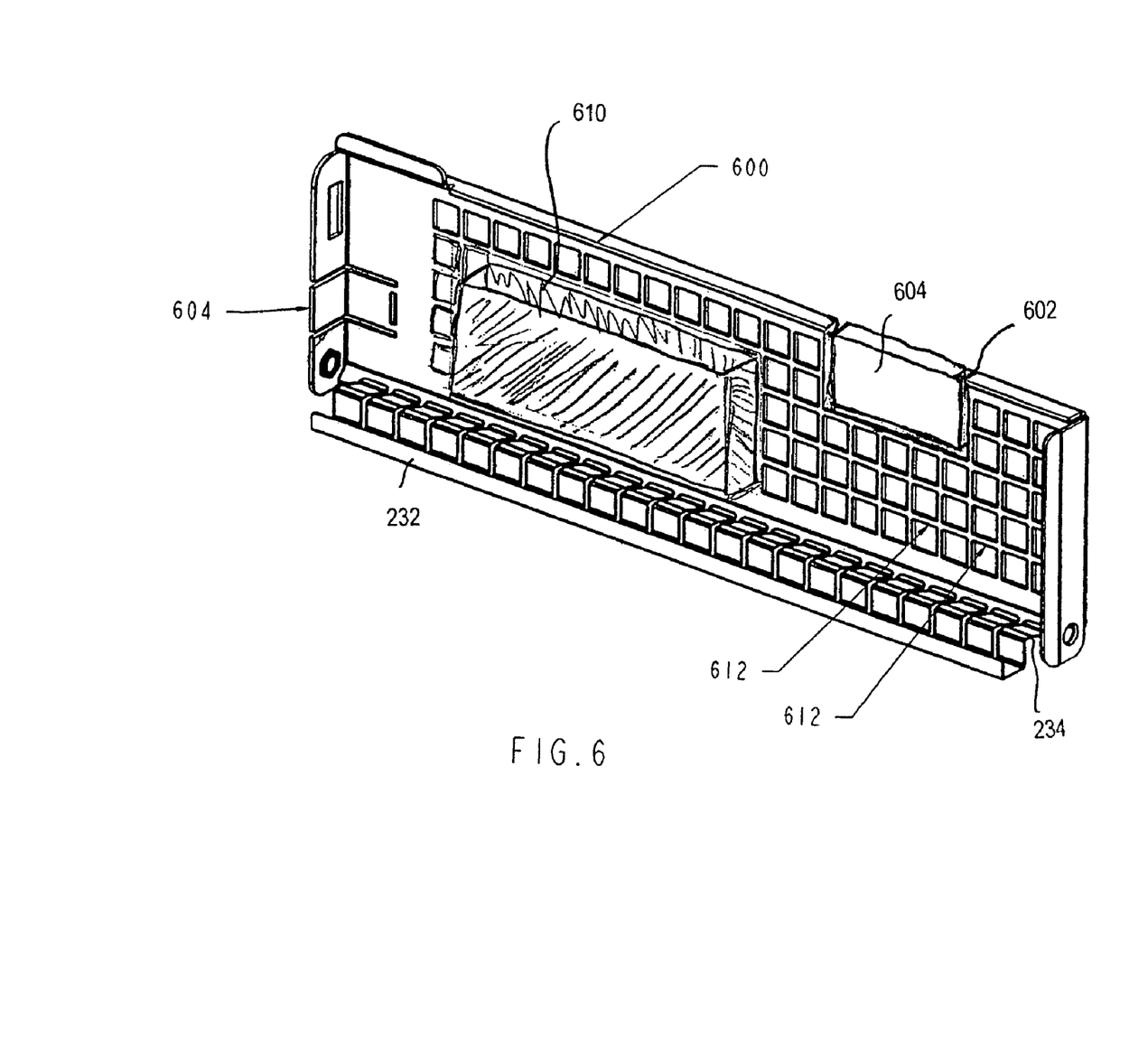
FIG. 6 shows another embodiment of an I/O door, in accordance with embodiments of the present invention.

FIG. 6 shows another embodiment of an I/O door 600 defining a cable passage aperture 602 covered by an aperture cover 604. With this embodiment, I/O door 600 can be opened by the operator to access the I/O ports in order to couple an I/O connector (e.g., a network cable) with one of the I/O ports (e.g., network port 310a). After the network cable has been plugged into the network port 310a, the aperture cover 604 can be opened and the network cable can be passed through the cable passage aperture 602 to emerge from the front of the computer. This way, the primary I/O door 600 can be completely shut, leaving only a small aperture 602 through which one or more cables may pass. This arrangement can minimize the amount of electromagnetic signal leakage that may result when a cable is connected to one of the I/O ports and passed out of the front of the computer. The aperture cover 604 may be spring-loaded to provide a constant bias to keep cover 604 closed.

FIG. 6 also shows a compressible grounding member 610, which may be provided in accordance with some embodiments of the present invention. This grounding member 610 may comprise, for example, a mass of steel wool or a compressible foam block having a conductive metallic surface. The computer may be configured such that the ends of the I/O ports are set back from the front side of the computer. Thus, when the I/O door 220 described above is closed, there is a small gap between the fronts of the I/O ports and the back of the I/O door 200.

When the I/O door 600 shown in FIG. 6 is in the closed position, the grounding member 610 spans the gap between the I/O door 600 and the fronts of the I/O ports such that the conductive surface of the grounding member 610 contacts the fronts of the various I/O ports to provide an electrical connection between the I/O ports and the I/O door 600. The I/O door 600, in turn, may be electrically coupled to the computer chassis. This arrangement can be used to ground the I/O ports and discharge any undesirable buildup of electrical charge in the I/O ports. This can prevent damage to the components of the computer caused by static electricity. The grounding member 610 may be formed of a compressible or compliant material in order to accommodate variations in the positions of the I/O ports and to allow the I/O door 600 to be fully closed, even when a cable is coupled with one or more of the I/O ports. It may also be desirable for the grounding member 610 to be porous or to contain large apertures in order to allow cooling air to flow through the apertures 612 in the I/O door 600 into and/or out of the computer.

FIG. 6 also shows in greater detail an I/O door grounding flange 232 that may be used in accordance with various embodiments in order to improve the grounding of the I/O door. The I/O door may be grounded at the point where the door is hinged with the computer chassis 202, but the grounding flange 232 may provide additional grounding as well. In addition, the grounding flange 232 may provide shielding of electromagnetic signals around the edge of the I/O door. The flange 232 may be mounted directly onto the computer chassis 202 such that the flexible fingers 234 of the flange 232 contact the bottom edge of the I/O door 600 when the door is closed to provide improved grounding, while flexing in order to provide clearance for the door when moved to the open position.

With reference to FIGS. 2A-5, in accordance with some embodiments, a grounding shield 250 may be used to ground the various I/O connectors 102. The grounding shield 250 may be positioned such that shield 250 maintains electrical contact with one or more of the I/O connectors 102 covered by the I/O door 220 such that the I/O connectors 102 are grounded. The grounding shield 250 may be mounted to the computer chassis 202 and positioned to be in electrical contact with one or more of the I/O connectors 102 covered by the I/O door 220. As can be seen in FIG. 5, the grounding shield 250 may have a size much smaller than the size of the I/O port access aperture 222. Thus, cooling air is able to move freely through the I/O port access aperture 222 into and/or out of the computer chassis 202. This is in contrast with conventional I/O shields, which block the flow of air into the computer. In addition, the small size and simplicity of the grounding shield 250 facilitates simple manufacturing and installation.

In accordance with embodiments of the present invention, an I/O door may be used to block the emission of undesirable electromagnetic signals while enabling an operator to access the I/O ports of the computer. The I/O door can eliminate the need for I/O shields and can be used with any arrangement of I/O ports. Therefore, it may be no longer necessary to design and manufacture a customized I/O shield each time a new I/O port layout is produced. This can decrease the lead time needed to release new computers incorporating new motherboard designs and can further enable a single computer chassis design to be used with a plurality of motherboards without the need to maintain an inventory of I/O shields customized for each motherboard layout.

While the invention has been described in terms of particular embodiments and illustrative figures, those of ordinary skill in the art will recognize that the invention is not limited to the embodiments or figures described. For example, the embodiments described herein show a computer having an I/O door covering I/O ports provided on the front side of the computer. In other embodiments, the I/O ports and I/O door may be provided on other locations of the computer, such as the back side. In addition, the I/O connectors shown and described herein are mounted directly onto the surface of the motherboard of the computer. In other embodiments, the I/O connectors in the computer may be mounted on separate components, such as daughterboards or expansion cards.

In addition, in some embodiments, all of the I/O ports for the computer are provided at a single location accessible through the I/O port access aperture and covered by the movable I/O door. In other embodiments, additional I/O ports may be provided elsewhere on the computer which are not covered by the I/O door. For example, in the some embodiments, all of the network connectors are covered by the I/O door, and in other embodiments, some of the network connectors may be provided elsewhere. In yet other embodiments, an I/O shield may be used with a set of frequently used I/O ports, and an I/O door may be used with infrequently used ports.

It is also understood that I/O doors in accordance with embodiments of the present invention may not completely block all of the electromagnetic signals being generated within the computer 200. Depending on the intended installation site of the computer 200, different levels of electromagnetic emissions may be acceptable. For example, a manufacturer may design the I/O door to provide a sufficient level of shielding to pass one or more industry standards. The precise design and configuration of the I/O door may vary, depending on the computer and the desired level of acceptable EMI. In addition, although the I/O door may provide a sufficient level of EMI shielding without the need for an I/O shield, an I/O shield may be used in conjunction with an I/O door, in accordance with embodiments of the present invention. This may be desirable when the I/O shield covers some of the gaps between the I/O ports, but does not alone provide the desired level of shielding. An I/O door may be used to supplement the I/O shield's shielding capacity.

It will also be understood that I/O doors in accordance with other embodiments need not have the same or similar dimensions and position as the illustrated I/O door 220. For example, the I/O door may comprise a larger or smaller portion of the front side of the computer. In yet other embodiments, the I/O door may comprise substantially the entire front side of the computer chassis.

The figures provided are merely representational and may not be drawn to scale. Certain proportions thereof may be exaggerated, while others may be minimized. FIGS. 1-6 are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

We claim:

1. A computer system, comprising:
    a computer chassis configured to retain a motherboard having a plurality of input/output (I/O) connectors associated therewith;
    an electrically conductive door movable from an open position to a closed position, wherein when the door is in the open position, the plurality of I/O connectors are exposed, and when the door is in the closed position, the plurality of I/O connectors are at least partially covered; and
    an electrically-conductive grounding shield electrically coupled to the computer chassis and at least one of the plurality of I/O connectors.

2. The computer system of claim 1, further comprising the motherboard contained in the computer chassis and comprising the plurality of I/O connectors.

3. The computer system of claim 2, wherein:
    the motherboard comprises at least one component generating electromagnetic signals; and
    the door inhibits radiation of the electromagnetic signals beyond the computer chassis.

4. The computer system of claim 3, further comprising gaps adjacent the plurality of I/O connectors through which electromagnetic signals can pass before reaching the door.

5. The computer system of claim 1, wherein the door comprises a rotatable plate.

6. The computer system of claim 5, wherein the rotatable plate has a plurality of apertures formed therein.

7. The computer system of claim 5, wherein the door further comprises a compressible and conductive gasket that contacts at least one of the plurality of I/O connectors when the door is in the closed position.

8. The computer system of claim 1, wherein the open position includes removing the door from the chassis.

9. The computer system of claim 1, wherein the door further comprises a nonconductive portion.

10. The computer system of claim 1, wherein the plurality of I/O connectors comprise at least one network connection socket or at least one serial port.

11. The computer system of claim 1, wherein the door defines an access aperture configured to allow a cable to pass through the door and mate with one of the plurality of I/O connectors.

12. The computer system of claim 1, wherein:
    the computer chassis comprises a wall having an I/O port access aperture;
    the electrically conductive door is configured to cover the I/O port access aperture when in the closed position; and
    the electrically-conductive grounding shield is smaller than the I/O port access aperture such that cooling air can pass through the I/O port access aperture into and out of the computer chassis.

13. The computer system of claim 1, wherein the electrically-conductive grounding shield covers less than half of the I/O port access aperture such that cooling air can pass through the I/O port access aperture into and out of the computer chassis.

14. A computer system, comprising:
    a computer chassis configured to retain a motherboard having a plurality of input/output (I/O) connectors associated therewith; and
    an electrically conductive door movable from an open position to a closed position, wherein when the door is in the open position, the plurality of I/O connectors are exposed, and when the door is in the closed position, the plurality of I/O connectors are at least partially covered;
    wherein the door comprises an electrically conductive grounding member configured to contact one or more of the plurality of I/O connectors when the door is in the closed position.

15. The computer system of claim 14, wherein the electrically conductive grounding member comprises a compressible material.

16. The computer system of claim 14, wherein the electrically conductive grounding member allows air to pass therethrough.

17. The computer system of claim 16, wherein the electrically conductive grounding member is porous.

* * * * *